(12) United States Patent
Huang et al.

(10) Patent No.: US 12,282,239 B2
(45) Date of Patent: Apr. 22, 2025

(54) ARRAY SUBSTRATE AND LIQUID CRYSTAL DISPLAY PANEL

(71) Applicant: TCL CHINA STAR OPTOELECTRONICS TECHNOLOGY CO., LTD., Guangdong (CN)

(72) Inventors: Lei Huang, Guangdong (CN); Liu Yang, Guangdong (CN); Shumin Tang, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 98 days.

(21) Appl. No.: 18/357,215

(22) Filed: Jul. 24, 2023

(65) Prior Publication Data

US 2024/0219786 A1 Jul. 4, 2024

(30) Foreign Application Priority Data

Dec. 30, 2022 (CN) .......................... 202211740119.3

(51) Int. Cl.
*G02F 1/1362* (2006.01)
*G02F 1/1368* (2006.01)
*H01L 27/12* (2006.01)

(52) U.S. Cl.
CPC ...... *G02F 1/136227* (2013.01); *G02F 1/1368* (2013.01); *H01L 27/1248* (2013.01)

(58) Field of Classification Search
CPC ............. G02F 1/136227; G02F 1/1368; H01L 27/1248
USPC ..................................... 349/38, 141
See application file for complete search history.

(56) References Cited

U.S. PATENT DOCUMENTS

2022/0252955 A1* 8/2022 Hua ........................ G02F 1/167

* cited by examiner

*Primary Examiner* — Charles S Chang
(74) *Attorney, Agent, or Firm* — PV IP PC; Wei Te Chung

(57) ABSTRACT

An array substrate and a liquid crystal display panel are provided. The array substrate comprises a substrate; a first conductive layer arranged at a side of the substrate and comprising a common electrode; a second conductive layer arranged at a side of the first conductive layer away from the substrate and comprising a transparent shielding electrode; and a third conductive layer arranged at a side of the second conductive layer away from the substrate and comprising a connecting electrode; wherein, the connecting electrode is connected with the common electrode through a first through hole, the connecting electrode is connected with the transparent shielding electrode through a second through hole, and the first through hole is spaced from the second through hole.

18 Claims, 4 Drawing Sheets

ARRAY SUBSTRATE AND LIQUID CRYSTAL DISPLAY PANEL

TECHNICAL FIELD

The present disclosure relates to the field of the display technology, and in particular to an array substrate and a liquid crystal display panel.

BACKGROUND

In the existing liquid crystal display panel called LCD for short, a metal electrode in the same layer as a gate electrode is often used as a common electrode called Acom for short, which is used as a shielding electrode called Data BM Less and namely DBS for short of a data line together with a transparent electrode arranged in the same layer as a pixel electrode, reducing the effect of parasitic capacitance on the display. However, because the metal electrode is opaque and a gap between the pixel electrode and the transparent electrode is limited, the light-emitting area of the LCD panel and the light transmittance of the display panel are reduced.

Based on that, researchers provide a design of transparent storage capacity and shielding which is called TSS for short. A transparent conductive layer is added in the array substrate, and a transparent shielding electrode in the transparent conductive layer is used to replace the original shielding electrode and a part of the common electrode. Because the transparent shielding electrode and the pixel electrode are arranged in different layers, the TSS design can reduce the influence of the parasitic capacitance and effectively improve the light transmittance of the display panel.

However, referring to FIG. 1, in the existing TSS design, the common electrode 121 is electrically connected to the transparent shielding electrode 161 by a connecting electrode 181, which is arranged in the same layer as the pixel electrode. The connecting electrode 181 is connected to the common electrode 121 through a deep hole 101 and is connected to the transparent shielding electrode 161 through a shallow hole 102, and the deep hole 101 is communicated with the shallow hole 102. In the process of defining the deep hole 101 and the shallow hole 102, due to the appearance of undercut, the gate insulation layer has a crack risk at the junction of the deep hole 101 and the shallow hole 102, affecting the stability of the display panel.

Technical Problems

Embodiments of the present disclosure provide an array substrate and a liquid crystal display panel, reducing the crack risk of the gate insulation layer in the array substrate and improving the stability of the liquid crystal display panel.

Technical Solutions

To solve the above problems, solutions provided in the embodiments of the present disclosure are described as follows.

An embodiment of the present disclosure provides an array substrate. The array substrate comprises a substrate; a first conductive layer arranged at a side of the substrate and comprising a common electrode; a second conductive layer arranged at a side of the first conductive layer away from the substrate and comprising a transparent shielding electrode; and a third conductive layer arranged at a side of the second conductive layer away from the substrate and comprising a connecting electrode; wherein, the connecting electrode is connected with the common electrode through a first through hole, the connecting electrode is connected with the transparent shielding electrode through a second through hole, so as to realize an electric connection between the common electrode and the transparent shielding electrode; and the first through hole is spaced from the second through hole.

In an embodiment, the array substrate comprises sub-pixel areas and element areas arranged in array, and each of the element areas is located between two adjacent rows of the pixel areas, wherein the first through hole and the second through hole are disposed in two of the element areas corresponding to two of the sub-pixel areas.

In an embodiment, the sub-pixel areas comprise blue sub-pixel areas, red sub-pixel areas and green sub-pixel areas arranged in array, and the two sub-pixel areas are two adjacent blue sub-pixel areas.

In an embodiment, the array substrate further comprises a first insulation layer, a second insulation layer, a color resist layer, and a planarization layer, the first insulation layer, the second insulation layer, and the color resist layer are arranged between the first conductive layer and the second conductive layer, and the planarization layer is arranged between the second conductive layer and the third conductive layer; wherein the first through hole extends through the first insulation layer, the second insulation layer, the color resist layer, and the planarization layer and exposes the common electrode, and the second through hole extends through the planarization layer and exposes the transparent shielding electrode.

In an embodiment, the common electrode comprises a common connecting portion and a common connecting line connected with the common connecting portion; the transparent shielding electrode comprises shielding electrode bars and transparent connecting portions, each of the transparent connecting portions is connected with adjacent two of the shielding electrode bars; the connecting electrode comprises a first connecting portion, a second connecting portion, and a connecting line connected with the first connecting portion and the second connecting portion; wherein the first through hole exposes the common connecting portion, and the first connecting portion is connected with the common connecting portion through the first through hole; the second through hole exposes a corresponding one of the transparent connecting portions, and the second connecting portion is connected with a corresponding one of the transparent connecting portions through the second through hole.

In an embodiment, the array substrate comprises thin film transistors, the first conductive layer further comprises gate lines and gate electrodes of the thin film transistors connected with the gate lines, and the common electrode is spaced from the gate lines and the gate electrodes; the array substrate further comprises a fourth conductive layer comprising data lines; and the third conductive layer further comprises a pixel electrode spaced from the connecting electrode; wherein the shielding electrode bars extend along an extending direction of the gate lines and are arranged along an extending direction of the data lines; a projection of the shielding electrode bars on the substrate covers a projection of the pixel electrode on the substrate, a projection of at least part of the gate lines on the substrate, and a part of a projection of the data lines on the substrate.

In an embodiment, the connecting electrode extends along the extending direction of the gate lines.

In an embodiment, a projection of the connecting line on the substrate and a projection of the shielding electrode bar on the substrate cover the projection of the data line on the substrate.

In an embodiment, the common connecting line comprises a first common connecting line and a second common connecting line, the first common connecting line is parallel to the gate lines, and the second common connecting line is vertically connected with the first common connecting line; wherein a projection of the second common connecting line on the substrate overlaps with a projection of a main portion of the pixel electrode on the substrate.

In an embodiment, the blue sub-pixel areas are reduced by 5%-15%.

An embodiment of the present disclosure provides a liquid crystal display panel comprising a color filter substrate, an array substrate described above and a liquid crystal layer sandwiched between the array substrate and the color filter substrate.

Beneficial Effects

In the array substrate and the liquid crystal display panel provided in the embodiments of the present disclosure, the first through hole and the second through hole in the array substrate are spaced from each other, reducing the crack risk of the gate insulation layer and improving the stability of the array substrate.

BRIEF DESCRIPTION OF THE DRAWINGS

The technical solutions and other beneficial effects of the present disclosure is made clear through the detailed description of the specific embodiments of the present disclosure in conjunction with the accompanying drawings.

Figure 1:
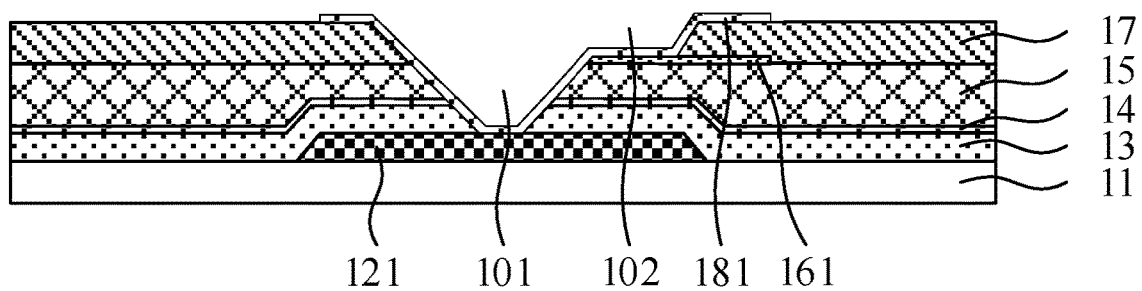
FIG. 1 is a sectional structural schematic diagram of an array substrate provided in prior art.

Reference number are as follows: array substrate 10, substrate 11, first conductive layer 12, common electrode 121, gate line 122, gate electrode 123, common connecting portion 124, first common connecting line 125, second common connecting line 126, first insulation layer 13, second insulation layer 14, color resist layer 15, second conductive layer 16, transparent shielding electrode 161, shielding electrode bar 162, transparent connecting portion 163, planarization layer 17, third conductive layer 18, connecting electrode 181, first connecting portion 182, second connecting portion 183, connecting line 184, fourth conductive layer 19, data line 191, source electrode 192, drain electrode 193, pixel electrode connecting portion 194, first through hole 101, second through hole 102, thin film transistor 111, pixel area PA, element area EA, red pixel area R, green pixel area G, and blue pixel area B.

DETAILED DESCRIPTION OF EMBODIMENTS

The technical solutions in the embodiments of the present disclosure are clearly and completely described as follows with reference to the accompanying drawings in the embodiments. It is apparent that the described embodiments are only a part of the embodiments of the present disclosure, and not all of the embodiments. All other embodiments obtained by a person skilled in the art based on the embodiments of the present disclosure without inventive efforts are within the scope of the present disclosure.

In the description of the present disclosure, it is to be understood that the oriental and the positional relationships of the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. are based upon the oriental or positional relationship shown in the drawings, are merely for facilitating and simplifying the description of the present disclosure, and do not indicate or imply that the device or components referred to have a specific orientation, and are constructed and operated in a specific orientation. Therefore, it should not be construed as limiting the disclosure. Moreover, the terms "first" and "second" are used for descriptive purposes only and are not to be construed as indicating or implying a relative importance or implicitly indicating the number of indicated technical features. Thus, features defining "first" or "second" may include one or more of the described features either explicitly or implicitly. In the description of the present disclosure, the meaning of "a plurality of" is two or more unless specifically defined otherwise.

In view of the existing TSS design, the connecting line is connected to the common electrode and the transparent shielding electrode respectively through the deep hole and the shallow hole, and the deep hole and shallow hole are communicated with each other, which leads to the crack risk of the gate insulation layer. Embodiments of the present disclosure provides an array substrate and a liquid crystal display panel to alleviate the problem.

In an embodiment of the present disclosure, referring to FIGS. 2 to 8, an array substrate 10 provided in the embodiment comprises: a substrate 11;
  a first conductive layer 12 arranged at a side of the substrate 11 and comprising a common electrode 121;
  a second conductive layer 16 arranged at a side of the first conductive layer 12 away from the substrate 11 and comprising a transparent shielding electrode 161; and
  a third conductive layer 18 arranged at a side of the second conductive layer 16 away from the substrate 11 and comprising a connecting electrode 181;
  wherein, the connecting electrode 181 is connected with the common electrode 121 through a first through hole 101, the connecting electrode 181 is connected with the transparent shielding electrode 161 through a second through hole 102, so as to realize an electric connection between the common electrode 121 and the transparent shielding electrode 161; and the first through hole 101 is spaced from the second through hole 102.

In the embodiment of the present disclose, the first through hole and the second through hole are spaced, decreasing the the crack risk of the gate insulation layer and improving the stability of the array substrate.

Figure 6:
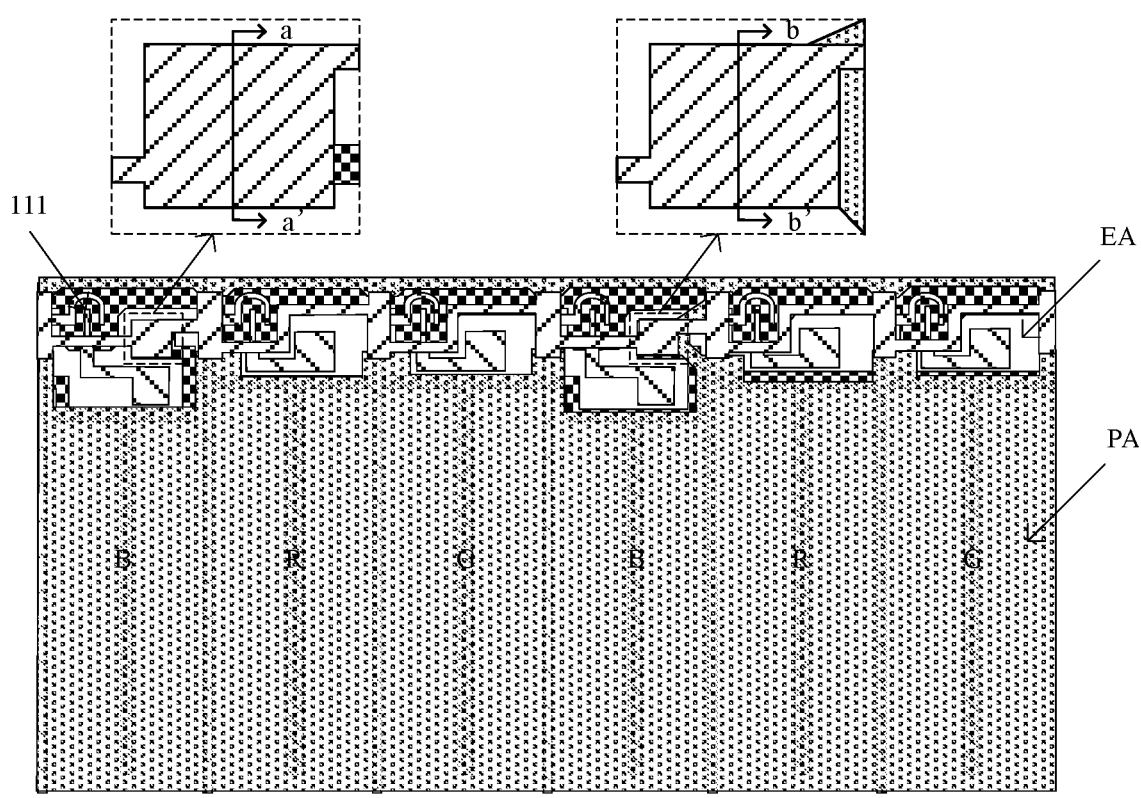
FIG. 6 is a planar structural schematic diagram of a stack of a first fourth conductive layer to a fourth conductive layer of an array substrate provided in an embodiment of the present disclosure.

The array substrate comprises pixel areas PA and element areas EA distributed in array. Each element area EA is located between two adjacent rows of the pixel areas PA. The element area EA is used to dispose the thin film transistor 111 and other elements and a part of signal lines. The pixel area PA comprises blue pixel areas B, red pixel areas R and green pixel areas G arranged horizontally as shown in FIG. 6. Each of the pixel areas PA corresponds to one of the element areas EA.

In an embodiment, the substrate 11 may be an inorganic substrate, such as glass. The substrate 11 may further be an organic substrate, such as PET.

Figure 2:
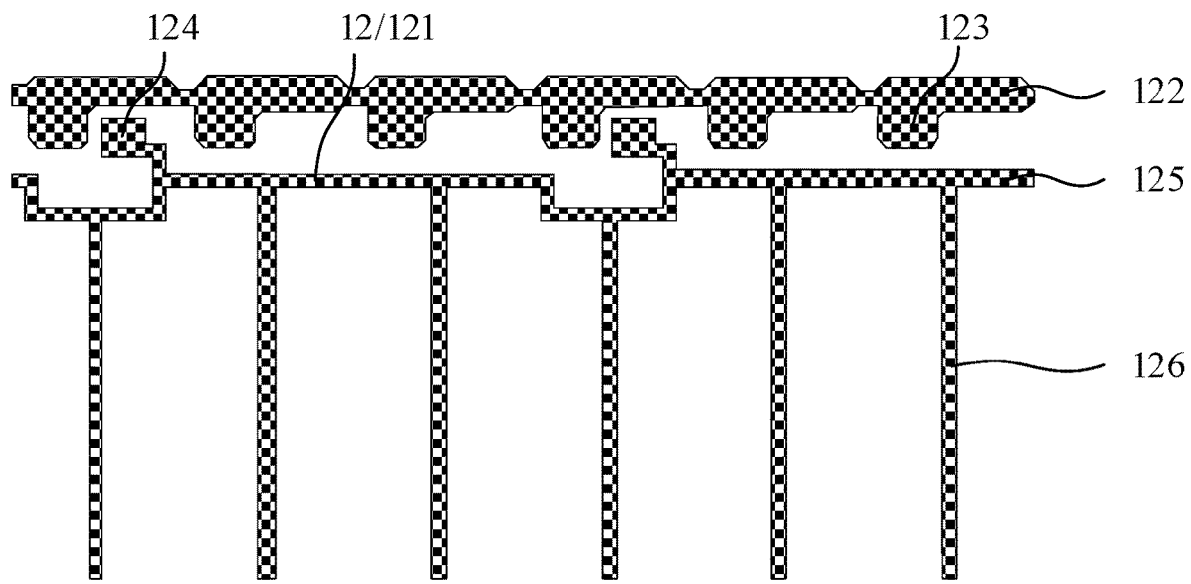
FIG. 2 is a planar structural schematic diagram of a first conductive layer of an array substrate provided in an embodiment of the present disclosure.

In an embodiment, referring to FIGS. 2 and 6, the first conductive layer 12 further comprises gate lines 122 and gate electrodes 123 of the thin film transistors. The gate lines 122 are connected with the gate lines 123. The common electrode 121 is spaced from the gate lines 122 and the gate electrodes 123, thus keeping the common electrode 121 insulated from the gate lines 122. The common electrode 121 comprises a common connecting portion 124 and a common connecting line connected with the common connecting portion 124. The common connecting line comprises a first common connecting line 125 and a second common connecting line 126. The first common connecting line 125 is parallel to the gate lines 122, and a projection of the first common connecting line 125 on the substrate 11 is disposed outside a projection of a pixel electrode (not shown) on the substrate 11 or overlaps an edge of the projection of the pixel electrode (not shown) on the substrate 11, avoiding the first common connecting line 125 affecting the light transmittance of the pixel area PA. The second common connecting line 126 is vertically connected with the first common connecting line 125 and extends through the pixel area PA. A projection of the second common connecting line 126 on the substrate 11 overlaps with a projection of a main portion of the pixel electrode on the substrate, reducing the shadow problem at the main portion of the pixel electrode.

Figure 3:
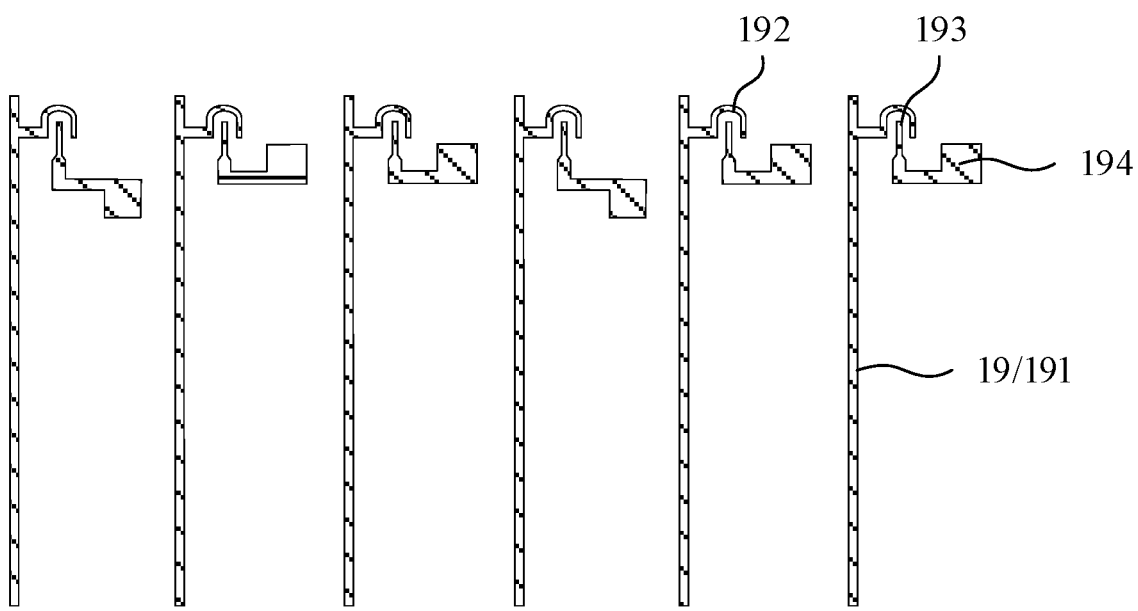
FIG. 3 is a planar structural schematic diagram of a second conductive layer of an array substrate provided in an embodiment of the present disclosure.

In an embodiment, referring to FIGS. 3 and 6, the array substrate 10 further comprises a fourth conductive layer 19. The fourth conductive layer 19 comprises data lines 191, source electrodes 192 and drain electrodes 193 of the thin film transistors, and pixel electrode connecting portions 194. The pixel electrode connecting portion 194 is connected with the drain electrode 193 and is electrically connected with the corresponding pixel electrode.

Figure 4:
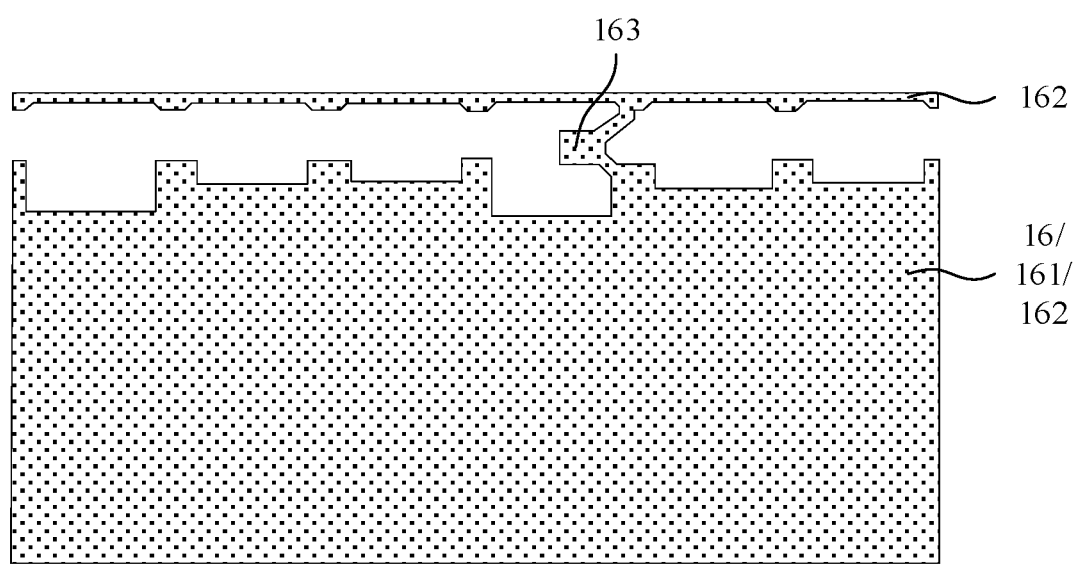
FIG. 4 is a planar structural schematic diagram of a third conductive layer of an array substrate provided in an embodiment of the present disclosure.

In an embodiment, referring to FIGS. 4 and 6, the transparent shielding electrode 161 comprises shielding electrode bars 162 and transparent connecting portions 163. The shielding electrode bars 162 extend along an extending direction of the gate lines 122 and are arranged along an extending direction of the data lines 191, and each of the transparent connecting portions 163 is connected with the neighboring shielding electrode bars 162. A projection of the shielding electrode bars 162 on the substrate 11 covers a projection of a part or all of the gate lines 122 on the substrate 11, thereby reducing the influence of the parasitic capacitance of the gate lines 122 on the pixel electrode. The projection of the shielding electrode bars 162 on the substrate 11 further covers a part of a projection of the data lines 191 on the substrate 11 and a projection of the pixel electrode on the substrate 11, thus reducing the influence of the parasitic capacitance of the data lines 191 on the pixel electrode.

Figure 5:
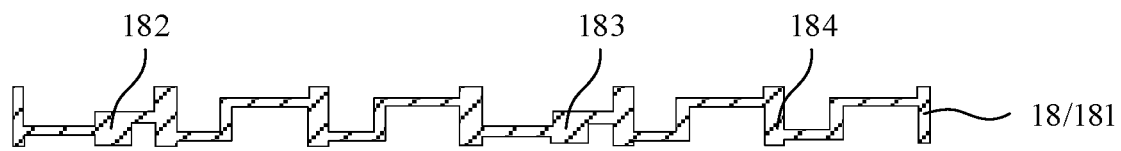
FIG. 5 is a planar structural schematic diagram of a fourth conductive layer of an array substrate provided in an embodiment of the present disclosure.

In an embodiment, referring to FIGS. 5 and 6, the third conductive layer 18 further comprises a pixel electrode, which is not shown in the attached drawings and can refer to the pixel electrode known to the person skilled in the art, and is not limited here. The pixel electrode is arranged in the pixel area PA. The connecting electrode 181 is arranged in the element area EA, and extends along the extending direction of the gate lines 122, even crossing one row of the element area EA. The pixel electrode and the connecting electrode 181 are spaced and insulated. The connecting electrode 181 comprises a first connecting portion 182, a second connecting portion 183, and a connecting line 184 connected with the first connecting portion 182 and the second connecting portion 184. A projection of the first connecting portion 182 on the substrate 11 overlaps a part or the whole of a projection of the common connecting portion 124 on the substrate 11. A projection of the second connecting portion 183 on the substrate 11 overlaps a part or the whole of the projection of the transparent connecting portion 163 on the substrate 11. A projection of the connecting line 184 on the substrate 11 and a projection of the shielding electrode bar 162 on the substrate 11 cover the projection of the data line 191 on the substrate 11. Thus, the influence of the parasitic capacitance of the data lines 191 on the pixel electrode can be further reduced.

Figure 7:
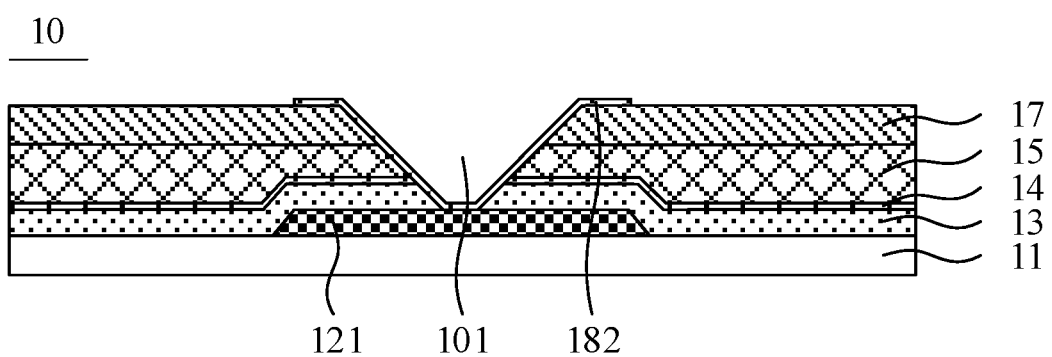
FIG. 7 is a sectional structural schematic diagram of an array substrate along the direction aa' in FIG. 6 in the embodiment of the present disclosure.
Figure 8:
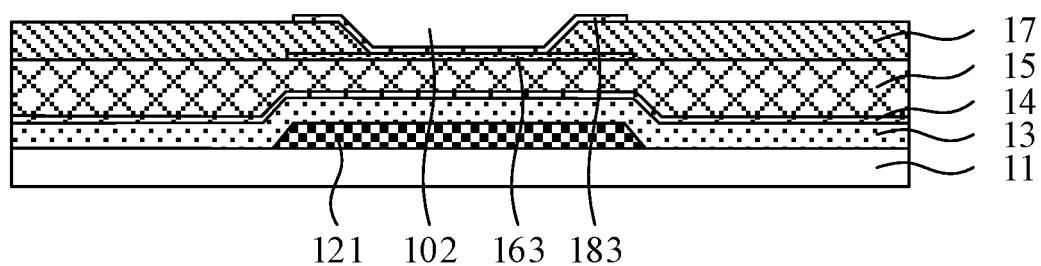
FIG. 8 is a sectional structural schematic diagram of an array substrate along the direction bb' in FIG. 6 in the embodiment of the present disclosure.

Further, referring to FIGS. 7 and 8, the array substrate 10 also comprises a first insulation layer 13, a second insulation layer 14, a color resist layer 15, and a planarization layer 17. The first insulation layer 13 is arranged between the first conductive layer 12 and the fourth conductive layer 19. The second insulation layer 14 and the color resist layer 15 are arranged between the fourth conductive layer 19 and the second conductive layer 16. And the planarization layer 17 is arranged between the second conductive layer 16 and the third conductive layer 18. The color resist layer 16 comprises red color resists, green color resists and blue color resists arranged sequentially along the extending direction of the gate lines 122. The red color resists correspond to the red pixel areas R, the green color resists correspond to the green pixel areas G, and the blue color resists correspond to the blue pixel area B.

The first through hole 101 extends through the first insulation layer 13, the second insulation layer 14, the color resist layer 15, and the planarization layer 17 and exposes the common connecting portion 124, and the first connecting portion 182 is connected with the common connecting portion 124 through the first through hole 101. And the second through hole 102 extends through the planarization layer 17 and exposes the transparent connecting portion 163, and the second connecting portion 183 is connected with the transparent connecting portion 163 through the second through hole 102, thus realizing the electrical connection between the common electrode 121, the connecting electrode 181 and the transparent shielding electrode 161, and the common electrode 121 receiving a common signal.

The first through hole 101 and the second through hole 102 are respectively located in two of the element areas EA. The two element areas EA may correspond to two adjacent blue pixel areas B located in the same row and separated by a red pixel area R and a green pixel area G, as shown in FIG. 6, or may correspond to two non-adjacent blue pixel areas B in the same row. Thus, all common electrodes 121 and transparent shielding electrodes 161 are electrically connected through the connecting electrodes 181. Due to the design of the first through hole 101 and the second through hole 102, the size of the element area EA is increased, reducing the area of the blue pixel area B by 5%-15%, such as 5%, 6%, 7%, 8%, 9%, 10%, 11%, 12%, 13%, 14%, 15%. The preferred reduction is 13%. In the subsequent process of white spot correction, the blue pixel is usually treated with gray degrading, and the loss caused by the gray degrading is about 10%. In the array substrate provided by the embodiment of the present disclosure, it is equivalent to treat the blue pixel with gray degrading by the design of the first through hole and the second through hole. The reduced area of the blue pixel area B by the pre-gray-degrading is similar to that by the gray degrading in the process of white spot correction, not affecting the light-emitting effect of the blue pixel.

Figure 9:
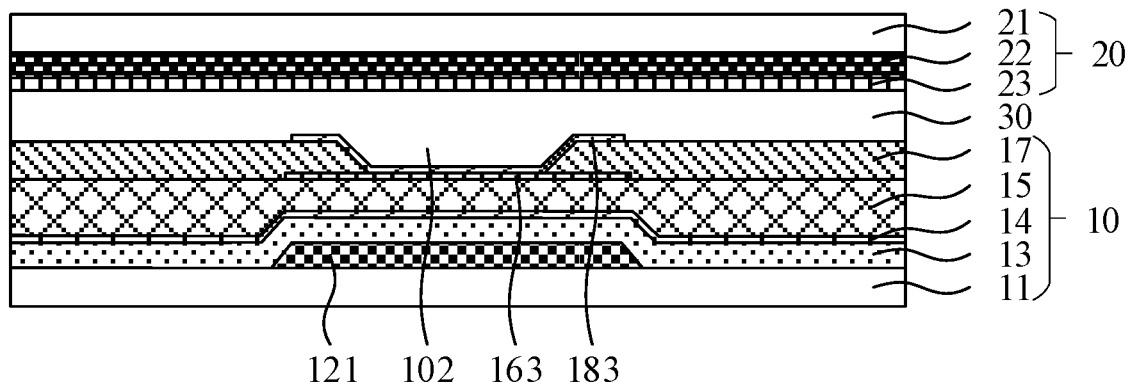
FIG. 9 is a sectional structural schematic diagram of a liquid crystal display panel along the direction aa' in FIG. 6 in the embodiment of the present disclosure.

Please refer to FIG. 9, an embodiment of the present disclosure provides a liquid crystal display panel. The liquid crystal display panel comprises a color filter substrate 20, a liquid crystal layer 30 and an array substrate 10 described in any embodiment of the present disclosure. The color filter substrate 20 and the array substrate 10 are arranged opposite to each other, and the liquid crystal layer 30 is sandwiched between the array substrate 10 and the color filter substrate 20. The color filter substrate 20 comprises a substrate 21, a black matrix layer 22 and a common electrode layer 23.

In summary, in the array substrate and the liquid crystal display panel provided in the embodiments of the present disclosure, the first through hole and the second through hole in the array substrate are disposed spaced from each other, reducing the crack risk of the gate insulation layer and improving the stability of the array substrate.

The array substrate and liquid crystal display panel provided in the embodiments of the present disclosure are described in detail above. The principle and implementations of the present disclosure are described in this specification by using specific examples. The description about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present disclosure.

What is claimed is:

1. An array substrate comprising:
a substrate;
a first conductive layer arranged at a side of the substrate and comprising a common electrode;
a second conductive layer arranged at a side of the first conductive layer away from the substrate and comprising a transparent shielding electrode; and
a third conductive layer arranged at a side of the second conductive layer away from the substrate and comprising a connecting electrode;
wherein the connecting electrode is connected with the common electrode through a first through hole, and connected with the transparent shielding electrode through a second through hole spaced from the first through hole to realize an electric connection between the common electrode and the transparent shielding electrode.

2. The array substrate according to claim 1, further comprising sub-pixel areas and element areas arranged in array, and each of the element areas is located between two adjacent rows of the pixel areas, wherein the first through hole and the second through hole are disposed in two of the element areas corresponding to two of the sub-pixel areas.

3. The array substrate according to claim 2, wherein the sub-pixel areas comprise blue sub-pixel areas, red sub-pixel areas and green sub-pixel areas, and the two sub-pixel areas are two adjacent blue sub-pixel areas.

4. The array substrate according to claim 1, further comprising a first insulation layer, a second insulation layer, a color resist layer, and a planarization layer, wherein the first insulation layer, the second insulation layer, and the color resist layer are arranged between the first conductive layer and the second conductive layer; and the planarization layer is arranged between the second conductive layer and the third conductive layer;
wherein the first through hole penetrates through the first insulation layer, the second insulation layer, the color resist layer, and the planarization layer to expose the common electrode; and the second through hole penetrates through the planarization layer to expose the transparent shielding electrode.

5. The array substrate according to claim 4, wherein the common electrode comprises a common connecting portion and a common connecting line connected with the common connecting portion; the transparent shielding electrode comprises shielding electrode bars and transparent connecting portions, each of the transparent connecting portions is connected with adjacent two of the shielding electrode bars; the connecting electrode comprises a first connecting portion, a second connecting portion, and a connecting line connected with the first connecting portion and the second connecting portion;
wherein the first through hole exposes the common connecting portion, and the first connecting portion is connected with the common connecting portion through the first through hole; the second through hole exposes a corresponding one of the transparent connecting portions, and the second connecting portion is connected with a corresponding one of the transparent connecting portions through the second through hole.

6. The array substrate according to claim 5, further comprising thin film transistors, wherein the first conductive layer further comprises gate lines and gate electrodes of the thin film transistors connected with the gate lines, and the common electrode is spaced from the gate lines and the gate electrodes; the array substrate further comprises a fourth conductive layer comprising data lines; and the third conductive layer further comprises a pixel electrode spaced from the connecting electrode;
wherein the shielding electrode bars extend along an extending direction of the gate lines and are arranged along an extending direction of the data lines; a projection of the shielding electrode bars on the substrate covers a projection of the pixel electrodes on the substrate, a projection of at least part of the gate lines on the substrate, and a part of a projection of the data lines on the substrate.

7. The array substrate according to claim 6, wherein the connecting electrode extends along the extending direction of the gate lines.

8. The array substrate according to claim 7, wherein a projection of the connecting line on the substrate and a projection of the shielding electrode bar on the substrate cover the projection of the data line on the substrate.

9. The array substrate according to claim 6, wherein the common connecting line comprises a first common connecting line parallel to the gate lines, and a second common connecting line perpendicularly connected with the first common connecting line;

wherein a projection of the second common connecting line on the substrate overlaps with a projection of a main portion of the pixel electrode on the substrate.

10. A liquid crystal display panel comprising a color filter substrate, an array substrate and a liquid crystal layer sandwiched between the array substrate and the color filter substrate, wherein the array substrate comprises:

a substrate;

a first conductive layer arranged at a side of the substrate and comprising a common electrode;

a second conductive layer arranged at a side of the first conductive layer away from the substrate and comprising a transparent shielding electrode; and a third conductive layer arranged at a side of the second conductive layer away from the substrate and comprising a connecting electrode;

wherein the connecting electrode is connected with the common electrode through a first through hole, and connected with the transparent shielding electrode through a second through hole spaced from the first through hole to realize an electric connection between the common electrode and the transparent shielding electrode.

11. The liquid crystal display panel according to claim 10, wherein the array substrate comprises sub-pixel areas and element areas arranged in array, and each of the element areas is located between two adjacent rows of the pixel areas, wherein the first through hole and the second through hole are disposed in two of the element areas corresponding to two of the sub-pixel areas.

12. The liquid crystal display panel according to claim 11, wherein the sub-pixel areas comprise blue sub-pixel areas, red sub-pixel areas and green sub-pixel areas, and the two sub-pixel areas are two adjacent blue sub-pixel areas.

13. The liquid crystal display panel according to claim 10, wherein the array substrate further comprises a first insulation layer, a second insulation layer, a color resist layer, and a planarization layer, wherein the first insulation layer, the second insulation layer, and the color resist layer are arranged between the first conductive layer and the second conductive layer, and the planarization layer is arranged between the second conductive layer and the third conductive layer;

wherein the first through hole penetrates through the first insulation layer, the second insulation layer, the color resist layer, and the planarization layer to expose the common electrode; and the second through hole penetrates through the planarization layer to expose the transparent shielding electrode.

14. The liquid crystal display panel according to claim 13, wherein the common electrode comprises a common connecting portion and a common connecting line connected with the common connecting portion; the transparent shielding electrode comprises shielding electrode bars and transparent connecting portions, each of the transparent connecting portions is connected with adjacent two of the shielding electrode bars; the connecting electrode comprises a first connecting portion, a second connecting portion, and a connecting line connected with the first connecting portion and the second connecting portion;

wherein the first through hole exposes the common connecting portion, and the first connecting portion is connected with the common connecting portion through the first through hole; the second through hole exposes a corresponding one of the transparent connecting portions, and the second connecting portion is connected with a corresponding one of the transparent connecting portions through the second through hole.

15. The liquid crystal display panel according to claim 14, wherein the array substrate comprises thin film transistors, the first conductive layer further comprises gate lines and gate electrodes of the thin film transistors connected with the gate lines, and the common electrode is spaced from the gate lines and the gate electrodes; the array substrate further comprises a fourth conductive layer comprising data lines; and the third conductive layer further comprises a pixel electrode spaced from the connecting electrode;

wherein the shielding electrode bars extend along an extending direction of the gate lines and are arranged along an extending direction of the data lines; a projection of the shielding electrode bars on the substrate covers a projection of the pixel electrode on the substrate, a projection of at least part of the gate lines on the substrate, and a part of a projection of the data lines on the substrate.

16. The liquid crystal display panel according to claim 15, wherein the connecting electrode extends along the extending direction of the gate lines.

17. The liquid crystal display panel according to claim 16, wherein a projection of the connecting line on the substrate and a projection of the shielding electrode bar on the substrate cover the projection of the data line on the substrate.

18. The liquid crystal display panel according to claim 15, wherein the common connecting line comprises a first common connecting line parallel to the gate lines, and a second common connecting line perpendicularly connected with the first common connecting line;

wherein a projection of the second common connecting line on the substrate overlaps with a projection of a main portion of the pixel electrode on the substrate.

\* \* \* \* \*